United States Patent
Chen

(10) Patent No.: US 9,158,170 B2
(45) Date of Patent: Oct. 13, 2015

(54) LCD DEVICE, ARRAY SUBSTRATE, AND METHOD OF MANUFACTURING THE ARRAY SUBSTRATE

(75) Inventor: Cheng-hung Chen, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 444 days.

(21) Appl. No.: 13/581,308

(22) PCT Filed: Jun. 12, 2012

(86) PCT No.: PCT/CN2012/076749
§ 371 (c)(1),
(2), (4) Date: Aug. 25, 2012

(87) PCT Pub. No.: WO2013/181857
PCT Pub. Date: Dec. 12, 2013

(65) Prior Publication Data
US 2013/0321724 A1  Dec. 5, 2013

(30) Foreign Application Priority Data
Jun. 5, 2012  (CN) .......................... 2012 1 0183072

(51) Int. Cl.
| | |
|---|---|
| *G02F 1/1333* | (2006.01) |
| *G02F 1/1345* | (2006.01) |
| *G02F 1/1362* | (2006.01) |
| *G02F 1/1337* | (2006.01) |
| *G02F 1/137* | (2006.01) |

(52) U.S. Cl.
CPC *G02F 1/136286* (2013.01); *G02F 2001/13775* (2013.01); *G02F 2001/133742* (2013.01); *G02F 2001/136254* (2013.01); *G02F 2001/136272* (2013.01); *H01L 2924/0002* (2013.01)

(58) Field of Classification Search
CPC .............. G02F 1/13452; G02F 1/1309; G02F 1/136204; G02F 1/136259; G02F 1/1345; G02F 1/13458; G02F 1/13454; G09G 3/3648; G09G 3/006; G09G 2330/08; G09G 2300/04; G09G 2300/0876
USPC .............................. 349/149–152, 40, 54, 192
See application file for complete search history.

(56) References Cited

U.S. PATENT DOCUMENTS

| | | | |
|---|---|---|---|
| 7,956,945 B2 * | 6/2011 | Kim ................................ 349/40 |
| 2006/0164587 A1 * | 7/2006 | Oh ................................. 349/152 |
| 2008/0123005 A1 * | 5/2008 | Sohn et al. ..................... 349/40 |
| 2008/0170195 A1 * | 7/2008 | Kwon et al. ................... 349/143 |
| 2010/0002180 A1 * | 1/2010 | Kim et al. ...................... 349/143 |

* cited by examiner

*Primary Examiner* — Edward Glick
*Assistant Examiner* — David Chung
(74) *Attorney, Agent, or Firm* — Andrew C. Cheng

(57) ABSTRACT

A liquid crystal display (LCD) device, an array substrate in the LCD device, and a method of manufacturing the array substrate are proposed. The LCD device includes an array substrate, a color filter (CF) substrate, and a liquid crystal (LC) layer sandwiched between the array substrate and the CF substrate. A voltage-applying circuit, an auxiliary wire, and a first test pad are disposed on the array substrate. The auxiliary wire is adjacent to the voltage-applying circuit. The auxiliary wire and the voltage-applying circuit are made of the same unit and undergo the same process. If the reference wire is examined to be defective, it could refer that the voltage-applying circuit might have a fault after references and comparisons. So the array substrate could be controlled or repaired, reducing the number of defective products.

7 Claims, 4 Drawing Sheets

401 — Corresponding to an active area, disposing a semiconductor array circuit on an array substrate; corresponding to the peripheral domain of the active area, disposing an auxiliary circuit, an auxiliary wire, and a first test pad on the array substrate. The auxiliary wire is adjacent to the auxiliary circuit. The auxiliary circuit comprises a voltage-applying circuit. The voltage-applying circuit is used for being connected to the semiconductor array circuit, which corresponds to the active area and for applying voltage drop between the array substrate and a CF substrate so that LCs in the voltage-applying circuit could form a pretilt angle. The voltage-applying circuit is used for being connected to the semiconductor array circuit. The voltage-applying circuit comprises a plurality of first conducting electronic units which are independent to one another. The auxiliary wire is serially connected via a plurality of second conducting electronic units which are independent to one another. The plurality of first conducting electronic units and the plurality of second conducting electronic units are made of the same units in each corresponding part. The auxiliary wire and the voltage-applying circuit are manufactured in the same process. The first test pad is disposed on each terminal of the auxiliary wire.

402 — Examining the first test pads placed at the terminals of the auxiliary wire to see if the auxiliary wire is turned on or has an abnormal resistor; the abnormality of the auxiliary wire meaning that the auxiliary wire has a fault; at this point, it inferring that the auxiliary circuit might have a fault as well.

403 — Controlling or repairing the array substrate which comprises the auxiliary circuit which is determined to be defective.

Fig. 6

LCD DEVICE, ARRAY SUBSTRATE, AND METHOD OF MANUFACTURING THE ARRAY SUBSTRATE

BACKGROUND OF THE INVENTION

1. Field of the Invention

The present invention relates to the field of liquid crystal displays (LCDs), and more particularly, to an LCD device, an array substrate, and a method of manufacturing the array substrate.

2. Description, of the Prior Art

Generally speaking, an LCD device in the conventional technology comprises an array substrate, a color filter (CF) substrate, and a liquid crystal (LC) layer sandwiched between the array substrate and the CF substrate. One kind of LCD device comprises a test pad, an auxiliary circuit, and a semiconductor array circuit. The three components are disposed on the array substrate. The auxiliary circuit comprises a voltage-applying circuit The voltage-applying circuit is connected to the semiconductor array circuit and the test pad.

During the PSVA (polymer stabilized vertical alignment) process step, the periphery of the CF substrate is cut so that the test pad on an active area of the array substrate could be exposed. Afterwards, voltage is applied to the test pad so that an electric field could be generated between the CF substrate and the array substrate via the voltage-applying circuit Afterwards, monomers in the LC layer sandwiched between the CF substrate and the array substrate are illuminated or heated so that a deviation of the LC orientation could be generated (that is, a pretilt angle could be formed), which would bring about the LC alignment.

However, the voltage and the circuit might be abnormal during the PSVA process step. Due to the abnormality, no electric field would be generated between the CF substrate and the array substrate; the LC molecules would not be deflected or aligned normally, either. Accordingly, the manufactured LCD device could not show images normally. The LC molecules could respond much slower as well. Moreover, the PSVA process is irreversible, which means that it is impossible to repair the LCD device in the subsequent processes. There would be a severe waste.

SUMMARY OF THE INVENTION

An object of the present invention is to provide an LCD device, an array substrate, and a method of manufacturing the array substrate for examining if the voltage-applying circuit is normal before the PSVA process. The voltage-applying circuit is used for manipulating the LC alignment to make the LC molecules form a pretilt angle. The normal voltage-applying circuit could reduce the number of defective products.

According to the present invention, an array substrate in a liquid crystal display (LCD) device comprises a semiconductor array circuit which corresponds to an active area, and an auxiliary circuit, an auxiliary wire, and a first test pad which correspond to the peripheral to domain of the active area. The auxiliary wire is disposed outside a cutting line at the periphery of a color filter (CF) substrate which corresponds to the peripheral domain of the active area. The auxiliary wire is adjacent to the auxiliary circuit. The auxiliary circuit comprises a voltage-applying circuit, the voltage-applying circuit is used for being connected to the semiconductor array circuit and for applying voltage drop between the array substrate and the is GP substrate so that liquid crystals (LCs) in the voltage-applying circuit could form a pretilt angle. The voltage-applying circuit is connected to the semiconductor array circuit. The voltage-applying circuit comprises a plurality of first conducting electronic units which are independent to one another. The auxiliary wire is serially connected via a plurality of second conducting electronic units which are independent to one another, the plurality of second conducting electronic units identically correspond to the plurality of first conducting electronic units one on one, and the auxiliary wire and the voltage-applying circuit are manufactured in the same process. The first test pads are disposed on both terminals of the auxiliary wire which is serially connected to another auxiliary wire.

In one aspect of the present invention, each second conducting electronic unit and each first conducting electronic unit comprise an identical first metallic unit, an identical second metallic unit, an identical transparent conducting unit, and an identical via.

According to the present invention, a method of manufacturing an array substrate in an LCD device comprises steps of: disposing a semiconductor array circuit which corresponds to an active area on the array substrate, disposing an auxiliary circuit, an auxiliary wire, and a first test pad which correspond to the peripheral domain of the active area on the array substrate, the auxiliary wire being adjacent to the auxiliary circuit, the auxiliary circuit comprising a voltage-applying circuit, the voltage-applying circuit used for being connected to the semiconductor array circuit and for applying voltage drop between the array substrate and a CF substrate so that liquid crystals (LCs) in the voltage-applying circuit could form a pretilt angle, the voltage-applying circuit connected to the semiconductor array circuit, the voltage-applying circuit comprising a plurality of first conducting electronic units which are independent to one another, the auxiliary wire serially connected via a plurality of second conducting electronic units which are independent to one another, the plurality of second conducting electronic units and the plurality of first conducting electronic units are made of the same units in each corresponding part, the auxiliary wire and the voltage-applying circuit manufactured in the same process, and the first test pads disposed on both terminals of the auxiliary wire which is serially connected to another auxiliary wire; examining the first test pads placed at the terminals of the auxiliary wire which are serially connected to another auxiliary wire to see if the auxiliary wire is turned on or has an abnormal resistor, the to abnormality of the auxiliary wire meaning that the auxiliary wire has a fault and that the auxiliary circuit might have a fault as well; controlling or repairing the array substrate which comprises the auxiliary circuit which is determined to be defective.

According to the present invention, an LCD device comprises: an array substrate, a CF substrate, and an LC layer sandwiched between the array substrate and the CF substrate; the array substrate comprising a semiconductor array circuit which corresponds to an active area, and an auxiliary circuit an auxiliary wire, and a first test pad which correspond to the peripheral domain of the active area, and the auxiliary wire disposed near the auxiliary circuit; the auxiliary circuit comprising a voltage-applying circuit, the voltage-applying circuit used for being connected to the semiconductor array circuit corresponding to the active area and applying voltage drop between the array substrate and the CF substrate so that a pretilt angle could be formed by LCs; the voltage-applying circuit comprising a plurality of first conducting electronic units which are independent to one another, the auxiliary wire comprising a plurality of second conducting: electronic units which are independent to one another, the plurality of first conducting electronic units identically corresponding to the plurality of second conducting electronic units one on one, and the auxiliary wire and the voltage-applying circuit manufactured in the same process; the first test pads disposed on both terminals of the auxiliary wire which is serially connected to another auxiliary wire.

In one aspect of the present invention, the plurality of second conducting electronic units comprise a first metallic unit, a second metallic unit, a transparent conducting unit, and a via which identically correspond to the first metallic unit, the second metallic unit, the transparent conducting unit, and the via used by the plurality of first conducting electronic units, respectively.

In another aspect of the present invention, the auxiliary wire is disposed outside a cutting line at the periphery of the CF substrate which corresponds to the peripheral domain of the active area, and the auxiliary wire is placed at the periphery of the auxiliary circuit.

In another aspect of the present invention, the auxiliary wire is disposed near sides of the array substrate.

In another aspect of the present invention, the number of the auxiliary wire is two, the auxiliary wires are respectively disposed near the opposite sides of the array substrate, the number of the first test pad is four, and the four first test pads are disposed on four corners of the array substrate, respectively.

In another aspect of the present invention, the number of the auxiliary wire is one, the auxiliary wire surrounds and is disposed on the array substrate which corresponds to the semiconductor array circuit, the number of the first test pad is four, and the four first test pads to are disposed on the font corners of the array substrate, respectively.

In another aspect of the present invention, the auxiliary circuit comprises a second test pad which is used for applying voltage to the voltage-applying circuit.

In contrast to the conventional technology, the present invention has an advantage that the number of defective products could be effectively reduced by controlling or repairing the array substrate. In the present invention, an auxiliary wire and an auxiliary circuit are disposed on the array substrate, and the auxiliary wire and the auxiliary circuit correspond to the peripheral domain of the active area. The auxiliary circuit comprises a voltage-applying circuit. The auxiliary wire is adjacent to the auxiliary circuit. First test pads are serially connected via the auxiliary wire and are placed at both terminals of the auxiliary wire. The first test pads are examined to see if the auxiliary wire is turned on or has an abnormal resistor. In the present invention, the auxiliary wire and the voltage-applying circuit in the auxiliary circuit are made of the same unit and undergo the same process, and the auxiliary wire is adjacent to the voltage-applying circuit. The auxiliary circuit might be defective after references and comparisons if the auxiliary wire is turned off or has an abnormal resistor. So, the array substrate could be controlled or repaired.

BRIEF DESCRIPTION OF THE DRAWINGS

FIG. 6 illustrates a flow chart of the method of manufacturing the array substrate shown in FIG. 1.

DETAILED DESCRIPTION OF THE PREFERRED EMBODIMENTS

Figure 1:
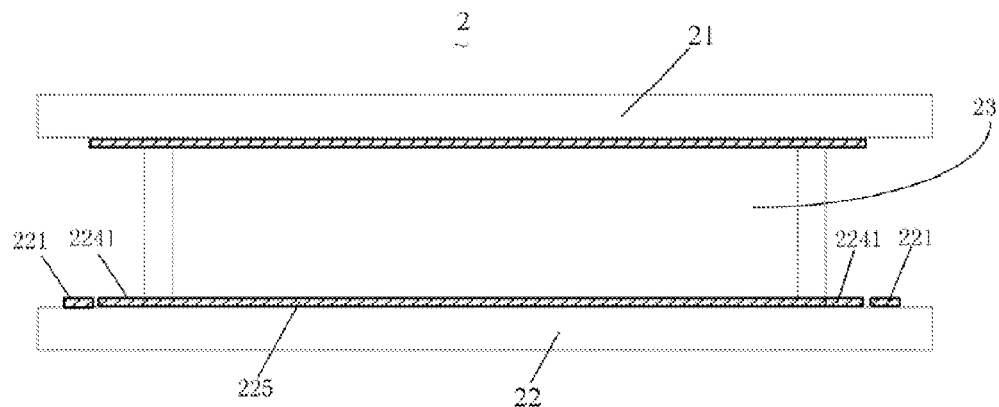
FIG. 1 shows a structure diagram of the LCD device according to the embodiment of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

Figure 2:
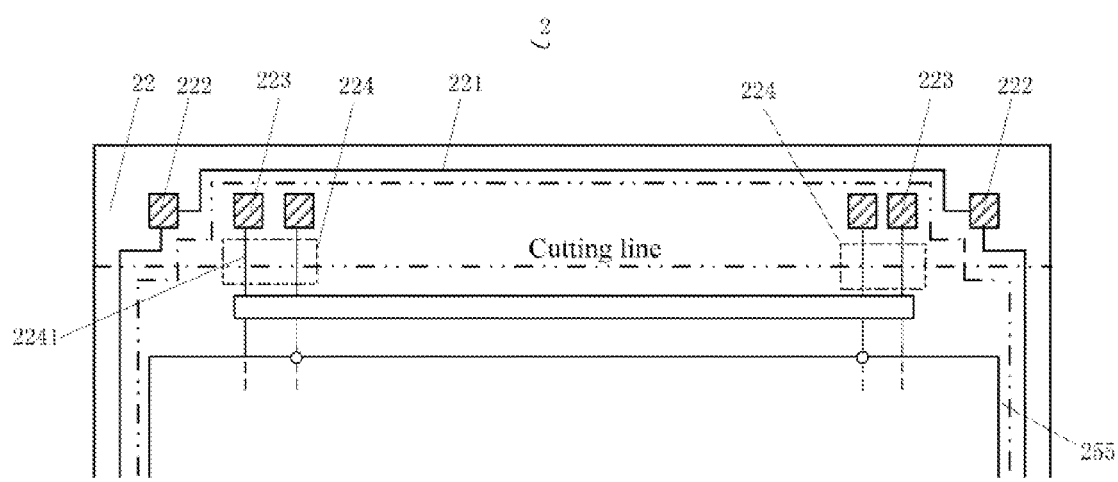
FIG. 2 shows a schematic diagram of connectional relations of all wires on an array substrate in the LCD device as shown in FIG. 1.
Figure 2:
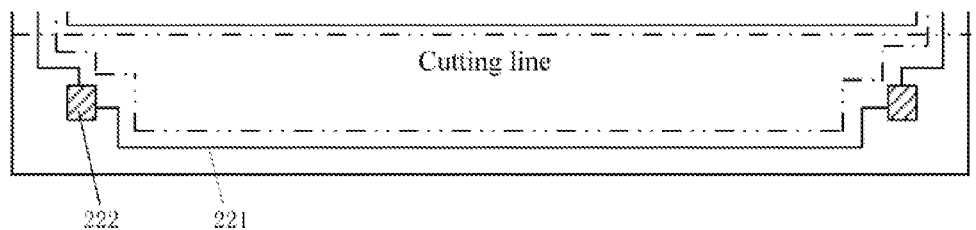
Figure 3:
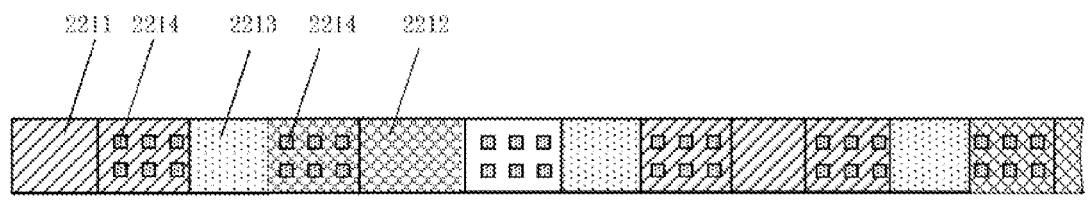
FIG. 3 shows a schematic diagram of connections of all parts of an auxiliary wire as shown in FIG. 1.

An LCD device 2 is provided in an embodiment of the present invention. Referring to FIGS. 1 to 3, FIG. 1 shows a structure diagram of the LCD device 2 according to the embodiment of the present invention, FIG. 2 shows a schematic diagram of connectional relations of all wires on an array substrate 22 in the LCD device 2 as shown in FIG. 1 and FIG. 3 shows a schematic diagram of connections of all parts of an auxiliary wire 221 as shown in FIG. 1.

The LCD device 2 comprises a CF substrate 21, an array substrate 22, and an LC layer 23 sandwiched between the array substrate 22 and the CF substrate 21. The array substrate 22 comprises an auxiliary wire 221, a first test pad 222, a second test pad 223, an auxiliary circuit 224, and a semiconductor array circuit 225. Corresponding to an active area the semiconductor array circuit 225 is disposed on the array substrate 22. Corresponding to the peripheral domain of the active area, the auxiliary wire 221, the first test pad 222, the second test pad 223, and the auxiliary circuit 224 are disposed on the array substrate 22. The four corners and the edge of the CF filter 21 are cut before the PSVA process, causing the auxiliary wire 221, the first test pad 222, the second test pad 223, and the auxiliary circuit 224 to be exposed.

The auxiliary circuit 224 comprises a voltage-applying circuit 2241. The voltage-applying circuit 2241 is connected to the second test pad 223 and the semiconductor array circuit 225. The voltage-applying circuit 2241 is used for applying: voltage to the second test pad 223. After the voltage is applied to the second test pad 223, an electric field would be formed between the array substrate 22 and the CF substrate 21. After the LC layer 23 are exposed in light or are heated, each LC molecule of the monomers form a pretilt angle. The voltage-applying circuit 2241 comprises a plurality of first conducting electronic units not shown). The plurality of first conducting electronic units are independent to one another.

There are four first test pads 222 disposed on the four corners of the array substrate 22, respectively. The four first test pads 222 are serially connected in sequence via the auxiliary wire 221, which forms a loop at sides of the array substrate 22.

The auxiliary wire 221 is serially connected via a plurality of second conducting electronic units (not shown). The plurality of second conducting electronic units are independent to one another. The plurality of first conducting electronic units and the plurality of second conducting electronic units are made of the same units in each corresponding part. In the present embodiment, the plurality of second conducting electronic units comprise a first to metallic unit 2211, a second metallic unit 2212, a transparent conducting unit 2213, and a via 2214. The auxiliary wire 221 is serially connected via the first metallic unit 2211, the second metallic unit 2212, the transparent conducting unit 2213, and the via 2214. The order could be arbitrary when the plurality of second conducting electronic units are serially connected. Similarly, the plurality of first conducting electronic units comprise the same units corresponding to the First metallic unit 2211, the second metallic unit 2212, the transparent conducting unit 2213, and the via 2214. More specifically, the formation and the quantity of the plurality of second conducting electronic units are determined by the plurality of first conducting electronic units; that is, the formation and the quantity of the plurality of second conducting electronic units vary according to the formation and the quantity of the plurality of first conducting electronic units. Moreover, the auxiliary wire 221 and the voltage-applying circuit 2241 are simultaneously manufactured in the same process. The auxiliary wire 221 is disposed on the peripheral domain of the auxiliary circuit 224; that is to say, the auxiliary wire 221 is disposed close to the auxiliary circuit 224 and close to the voltage-applying circuit 2241 in the auxiliary circuit 224. Particularly, an interval between the auxiliary wire 221 and the auxiliary circuit 224 could be designed to be smaller. For instance, the interval could be as small as the sophistication of the process could achieve.

In addition, the first metallic unit 2211, the second metallic unit 2212, the transparent conducting unit 2213, and the via 2214 could be periodically and repeated disposed, or arbitrarily and dispersedly disposed on the auxiliary wire 221. The number of all kinds of conducting electronic units could be different, and the order of all kinds of conducting electronic units could be different as well. When the first metallic unit 2211, the second metallic unit 2212, the transparent conducting unit 2213, and the via 2214 are periodically and repeated disposed, the period of the four units could be shorter. For instance, the period could be as short as the sophistication of the process could achieve. Of course, the period of the lour units could be longer.

What is needed to point out is that the definitions given in the present embodiment. All kinds of the conducting electronic units in the voltage-applying circuit are defined as the first conducting electronic units. All kinds of the conducting electronic units, comprising the first metallic unit 2211, the second metallic unit 2212. the transparent conducting unit 2213, and the via 2214, are defined as the second conducting electronic units. Therefore, the plurality of second conducting electronic units identically correspond to the plurality of first conducting electronic units one on one in the embodiment. More accurately, all of the plurality of second conducting electronic units and all of the plurality of first conducting electronic units are identical in each corresponding part. Or, some of the plurality of second conducting electronic units identically correspond to some of the plurality of first conducting electronic units one on one In advance, what is needed to point out is that the first metallic unit 2211, the second metallic unit 2212, the transparent conducting unit 2213, and the via 2214 all are concrete examples of the second conducting electronic units in the above-mentioned embodiment. The present invention is not limited to these concrete examples. Actually, the name and the number of the conducting electronic units could be changed depending on the units practically used in a product. The premise is that the plurality of second conducting electronic units and the plurality of first conducting electronic units are made of the same units in each corresponding part, which does not deviate from the scope of the present invention.

Besides, one common application is that, the semiconductor array circuit 225 has the same unit and undergoes the same manufacturing process as the auxiliary circuit 224.

Figure 4:
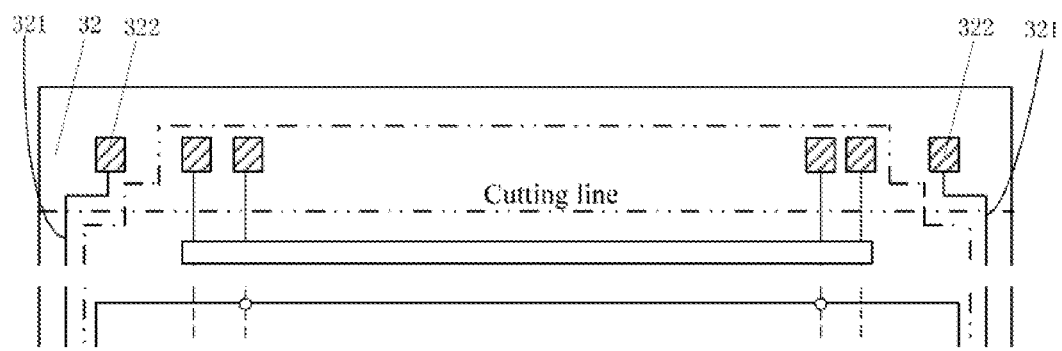
FIG. 4 shows auxiliary wires disposed on the left and right sides of the array substrate shown in FIG. 1.
Figure 4:
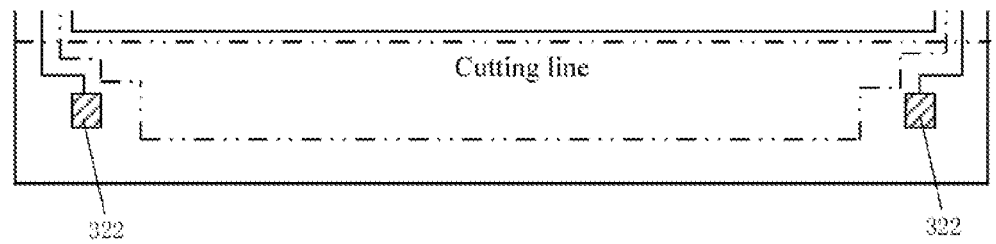
Figure 5:
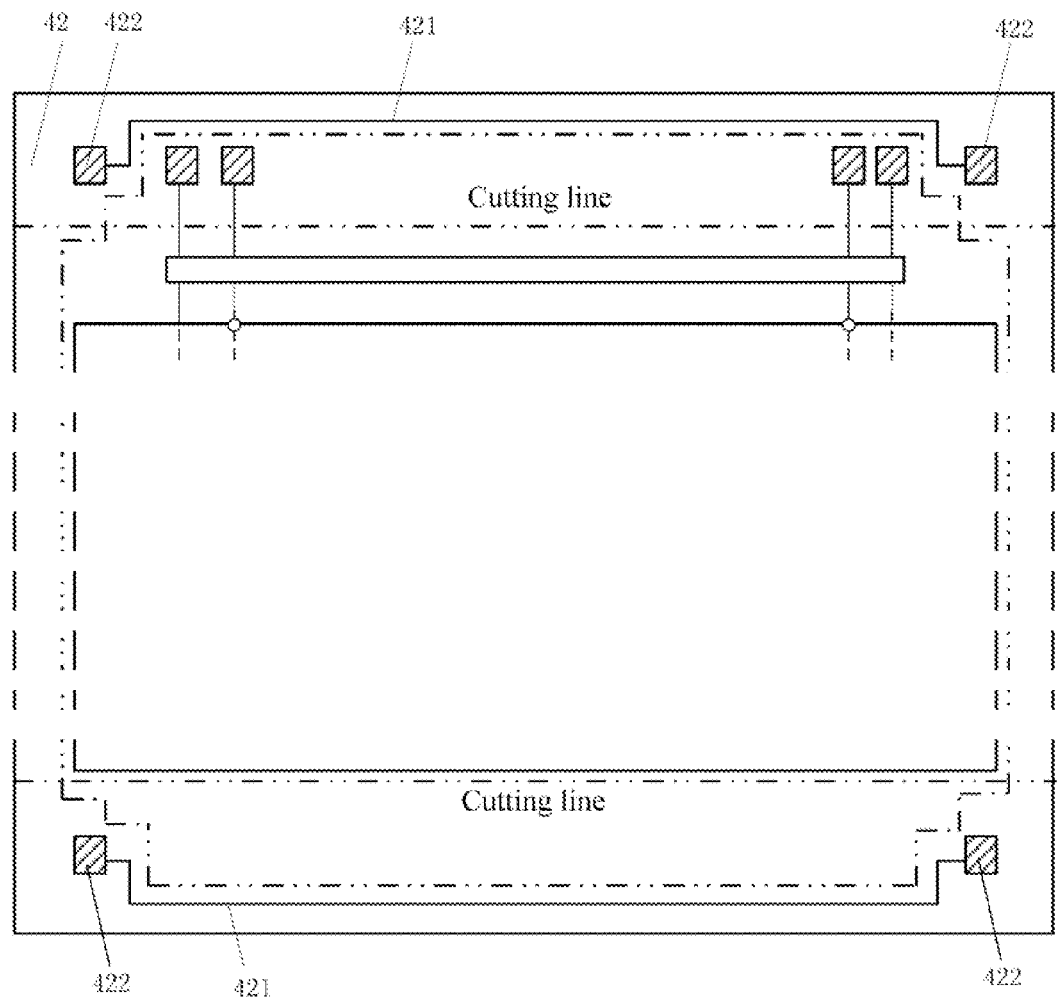
FIG. 5 shows auxiliary wires disposed on the upper and bottom sides of the array substrate shown in FIG. 1.

In addition, the auxiliary wire is flexible in the number and the routing. For example, in FIG. 4 two auxiliary wires 321 are disposed on the right and left sides of the array substrate 32, respectively. At this point, both terminals of each of the auxiliary wires 321 are connected to two first test pads 322 disposed on the same side, respectively. Or, two auxiliary wires 421 are disposed on the top and bottom sides of the array substrate 42, respectively. At this point, both terminals of each of the auxiliary wires 421 are connected to two first test pads 422 disposed on the same side, respectively, as shown in FIG. 5. The auxiliary wires are disposed on the opposite sides of the array substrate, respectively, as shown in FIG. 4 and FIG. 5.

In the present invention, the auxiliary wire is disposed at the peripheral domain of the auxiliary circuit and on the domain which is adjacent to the auxiliary circuit. The auxiliary wire and the voltage-applying circuit in the auxiliary circuit are made of the same unit and undergo the same process. The first test pads are serially connected via the auxiliary wire and are placed at the terminals of the auxiliary wire. The first test pads are examined to see if the auxiliary wire is turned on or has an abnormal resistor. The abnormality of the auxiliary wire means that the auxiliary wire has a fault. Further, it infers that the neighboring voltage-applying circuit might have a fault as well after references and comparisons.

Furthermore, another embodiment in which an array substrate is used in an LCD device is provided by the present invention. Please continue referring to FIG. 2 and FIG. 3 illustrating the array substrate. The array substrate has the same structure and performs the same functions as the array substrate 22 in the above-mentioned embodiment. Thus, the detailed description will not herein be repeated.

Moreover, another embodiment in which a method of manufacturing an array substrate is provided by the present invention. Please refer to FIG. 6 illustrating a flow chart of the method of manufacturing the array substrate 22 shown in FIG. 1. The method comprises the following steps of:

Step 401: corresponding to an active area, disposing a semiconductor array circuit on an array substrate; corresponding to the peripheral domain of the active area, disposing an auxiliary circuit, an auxiliary wire, and a first test pad on the array substrate;

The auxiliary wire is adjacent to the auxiliary circuit The auxiliary circuit comprises a voltage-applying circuit. The voltage-applying circuit is used for being connected to the semiconductor array circuit, which corresponds to the active area and for applying voltage drop between the array substrate and a CF substrate so that LCs in the voltage-applying circuit could form a pretilt angle. The voltage-applying circuit is used for being connected to the semiconductor array circuit. The voltage-applying circuit comprises a plurality of first conducting electronic units Which are independent to one another. The auxiliary wire is serially connected via a plurality of second conducting electronic units which are independent to one another. The plurality of first conducting electronic units and the plurality of second conducting electronic units are made of the same units in each corresponding part. The auxiliary wire and the voltage-applying circuit are manufactured in the same process. The first test pad is disposed on each terminal of the auxiliary wire.

Further, the auxiliary wire and the voltage-applying circuit could be simultaneously manufactured in the same process as the semiconductor array circuit. And further, the auxiliary wire and the auxiliary circuit Which comprises the voltage-applying circuit could be simultaneously manufactured in the same process as the semiconductor array circuit. For example, a metallic layer which corresponds to a thin film transistor (TFT) is thrilled on the semiconductor array circuit Which is disposed on a glass substrate and corresponds to the active area; at this point, a metallic layer of the voltage-applying, circuit which corresponds to the first conducting electronic units is formed on the surface of the glass substrate at the periphery of the corresponding active area, and a metallic layer which corresponds to the second conducting electronic units of the auxiliary wire is formed on the surface of the glass substrate at the periphery of the corresponding active area. Afterwards, the metallic layer on the semiconductor array circuit is etched; meanwhile, the metallic layer corresponding to the second conducting electronic units is etched, leaving a predetermined length of first metallic unit or a plurality of predetermined lengths of first metallic unit.

Or for example, a transparent conducting layer which corresponds to a pixel electrode in the semiconductor array circuit is formed on the surface of the glass substrate which corresponds to the active area, at this point, a transparent conducting layer of the voltage-applying circuit which corresponds to the first conducting electronic units is formed to on the surface of the glass substrate at the periphery of the corresponding active area; meanwhile, a transparent conducting layer of the auxiliary wire which corresponds to the second conducting electronic units is formed on the surface of the glass substrate at the periphery of the corresponding active area. Afterwards, the transparent conducting layer in the semiconductor array circuit is etched; meanwhile, the transparent conducting layer corresponding to the second conducting electronic units is etched, leaving a predetermined length of transparent conducting units or a plurality of predetermined lengths of transparent conducting units. In a similar way, the first metallic unit, the second metallic unit, the transparent conducting unit, and the via of the auxiliary wire would be electrically connected in the end. Of course, the requirement for realizing each section of the second conducting electronic units of the auxiliary wire to be electrically connected throughout the section is the same as that for manufacturing the voltage-applying circuit and the semiconductor array circuit. In other words, the predetermined position and structure of every component is required to be realized in the same process. In a normal condition, each section of the second conducting electronic units of the auxiliary wire is electrically connected throughout the section. In an abnormal or accident condition, each section of the second conducting electronic units of the auxiliary wire is unable to be electrically connected throughout the section. For example, sonic of the sections of the second conducting electronic units are electrically connected and the others are disconnected. It helps examine objects by examining if the auxiliary wire is turned on or has an abnormal resistor in the following examinations.

There are four first test pads on the array substrate. The four test pads are disposed at the four corners of the array substrate, respectively. The four first test pads are serially connected in sequence via the auxiliary wire, which forms a loop at the periphery of the array substrate. Otherwise, two auxiliary wires could be used. The auxiliary wires are disposed on two opposite sides of the array substrate, respectively. The terminals of each of the auxiliary wires are connected to two first test pads disposed on the same side.

Step 402: examining the first test pads placed at the terminals of the auxiliary wire to see if the auxiliary wire is turned on or has an abnormal resistor; the abnormality of the auxiliary wire meaning that the auxiliary wire has a fault; at this point, it inferring that the auxiliary circuit might have a fault as well;

Step 403: controlling or repairing the array substrate which comprises the auxiliary circuit which is determined to be defective.

In the present invention, the auxiliary wire is disposed on the array substrate, at the peripheral domain of the auxiliary circuit, and on the domain which is adjacent to the auxiliary circuit. The auxiliary wire and the voltage-applying circuit in the auxiliary circuit lo are made of the same unit and undergo the same process. The first test pads are serially connected via the auxiliary wire and are placed at the terminals of the auxiliary wire. The first test pads are examined to see if the auxiliary wire is turned on or has an abnormal resistor. The abnormality of the auxiliary wire means that the auxiliary wire has a fault. Further, it could infer that the neighboring voltage-applying circuit might have a fault as well after references and comparisons. Finally, the array substrate could be controlled or repaired. It helps reduce the number of defective products.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. An array substrate in a liquid crystal display (LCD) device, wherein
the array substrate comprises a semiconductor array circuit which corresponds to an active area, and an auxiliary circuit, an auxiliary wire, and a first test pad which correspond to the peripheral domain of the active area, the auxiliary wire is disposed outside a cutting line at the periphery of a color filter (CF) substrate which corresponds to the peripheral domain of the active area, the auxiliary wire is adjacent to the auxiliary circuit, the auxiliary circuit comprises a voltage-applying circuit, the voltage-applying circuit is used for being connected to the semiconductor array circuit and for applying voltage drop between the array substrate and the CF substrate so that liquid crystals (LCs) in the voltage-applying circuit could form a pretilt angle, and the voltage-applying circuit is connected to the semiconductor array circuit;
the voltage-applying circuit comprises a plurality of first conducting electronic units which are independent to one another, the auxiliary wire is serially connected via a plurality of second conducting electronic units which are independent to one another, the plurality of second conducting electronic units identically correspond to the plurality of first conducting electronic units one on one, and the auxiliary wire and the voltage-applying circuit are manufactured in the same process;
the first test pads are disposed on both terminals of the auxiliary wire which is serially connected to another auxiliary wire,
wherein each second conducting electronic units and each first conducting electronic units comprise an identical first metallic unit, an identical second metallic unit, an identical transparent conducting unit, and an identical via.

2. An LCD device, comprising:
an array substrate, a CF substrate, and an LC layer sandwiched between the array substrate and the CF substrate;
the array substrate comprising a semiconductor array circuit which corresponds to an active area, and an auxiliary circuit, an auxiliary wire, and a first test pad which correspond to the peripheral domain of the active area, and the auxiliary wire disposed near the auxiliary circuit;

the auxiliary circuit comprising a voltage-applying circuit, the voltage-applying circuit used for being connected to the semiconductor array circuit corresponding to the active area and applying voltage drop between the array substrate and the CF substrate so that a pretilt angle could be formed by LCs;

the voltage-applying circuit comprising a plurality of first conducting electronic units which are independent to one another, the auxiliary wire comprising a plurality of second conducting electronic units which are independent to one another, the plurality of first conducting electronic units identically corresponding to the plurality of second conducting electronic units one on one, and the auxiliary wire and the voltage-applying circuit manufactured in the same process;

the first test pads disposed on both terminals of the auxiliary wire which is serially connected to another auxiliary wire, wherein the plurality of second conducting electronic units comprise a first metallic unit, a second metallic unit, a transparent conducting unit, and a via, which identically correspond to the first metallic unit, the second metallic unit, the transparent conducting unit, and the via used by the plurality of first conducting electronic units, respectively.

3. The device as claimed in claim 2, wherein the auxiliary wire is disposed outside a cutting line at the periphery of the CF substrate which corresponds to the peripheral domain of the active area, and the auxiliary wire is placed at the periphery of the auxiliary circuit.

4. The device as claimed in claim 2, wherein the auxiliary wire is disposed near sides of the array substrate.

5. The device as claimed in claim 4, wherein the number of the auxiliary wire is two, the auxiliary wires are respectively disposed near the opposite sides of the array substrate, the number of the first test pad is four, and the four first test pads are disposed on four corners of the array substrate, respectively.

6. The device as claimed in claim 4, wherein the number of the auxiliary wire is one, the auxiliary wire surrounds and is disposed on the array substrate which corresponds to the semiconductor array circuit, the number of the first test pad is four, and the four first test pads are disposed on the four corners of the array substrate, respectively.

7. The device as claimed in claim 2, wherein the auxiliary circuit comprises a second test pad which is used for applying voltage to the voltage-applying circuit.

* * * * *